United States Patent [19]
Takahashi

[11] Patent Number: 4,675,545
[45] Date of Patent: Jun. 23, 1987

[54] WAVE SHAPING APPARATUS FOR ELIMINATING PULSE WIDTH DISTORTION

[75] Inventor: Noboru Takahashi, Aichi, Japan

[73] Assignee: Mitsubishi Denki Kabushiki Kaisha, Tokyo, Japan

[21] Appl. No.: 655,455

[22] Filed: Sep. 28, 1984

[30] Foreign Application Priority Data

Sep. 30, 1983 [JP] Japan .................................. 58-182209

[51] Int. Cl.⁴ ........................ H03K 3/017; H03K 5/04
[52] U.S. Cl. .................................... 307/265; 307/234; 307/272 R; 328/164; 328/111; 328/58
[58] Field of Search .................. 328/162, 164, 111, 58; 307/265, 234, 272 R, 601; 375/58, 60

[56] References Cited

U.S. PATENT DOCUMENTS

| | | | |
|---|---|---|---|
| 3,753,135 | 8/1973 | Kastner et al. | 329/106 |
| 3,766,323 | 10/1973 | Wittman | 179/16 E |
| 3,997,798 | 12/1976 | Breimesser | 328/111 |
| 4,227,054 | 10/1980 | Gilmer | 179/16 EA |

Primary Examiner—John S. Heyman
Assistant Examiner—Richard Roseen
Attorney, Agent, or Firm—Bernard, Rothwell & Brown

[57] ABSTRACT

An apparatus which eliminates pulse width distortion of a pulse train in a transmission system employs a counter which is initialized by detection of an initial pulse in the incoming pulse train, and which cyclically counts a plurality of clock signals in synchronism with each incoming pulse, and at a prescribed count value generates read signals delayed by the count value from the corresponding leading edges of the incoming pulses to operate a regenerator producing a regenerated pulse train from the incoming pulse values at the read signals.

7 Claims, 3 Drawing Figures

4,675,545

WAVE SHAPING APPARATUS FOR ELIMINATING PULSE WIDTH DISTORTION

BACKGROUND OF THE INVENTION

1. Field of the Invention

The present invention relates to a wave shaping apparatus which corrects wave distortion occurring in a transmission system such as a data link control system of a loop system by restoring the original wave shape.

2. Description of the Prior Art

In general, when data link control is performed, wave distortion occurring in the transmission system (e.g. cable, driver or receiver) may cause loss of the original data waveform. Particularly if the transmission system is constituted by loop system, as shown in FIG. 1, it is difficult to retransmit the input signal 2 without distortion to the next station using an optical switch 1, that is, hardware analysis is difficult.

SUMMARY OF THE INVENTION

A wave shaping apparatus of the invention detects the leading edge of an initial bit or pulse indicating the start of a data bit train in an incoming signal to initialize the count in a counter which cyclically counts clock pulses to produce bit sync signals, each bit sync signal being delayed from the leading edge of the corresponding incoming data bit by a prescribed number of clock pulses, for operating a pulse regenerator to produce a regenerated bit train from the incoming signal.

The use of a counter to cycle through its full count at a frequency equal to the incoming pulse frequency and to generate a bit sync signal delayed from the leading edge of each incoming bit enables regeneration of the bit train with a constant pulse width. Consequently if the wave shaping apparatus is applied to high level data link control method for example, hardware analysis can be performed.

DETAILED DESCRIPTION OF THE PREFERRED EMBODIMENT

An embodiment of the invention will now be described referring to the accompanying drawings.

Figure 2:
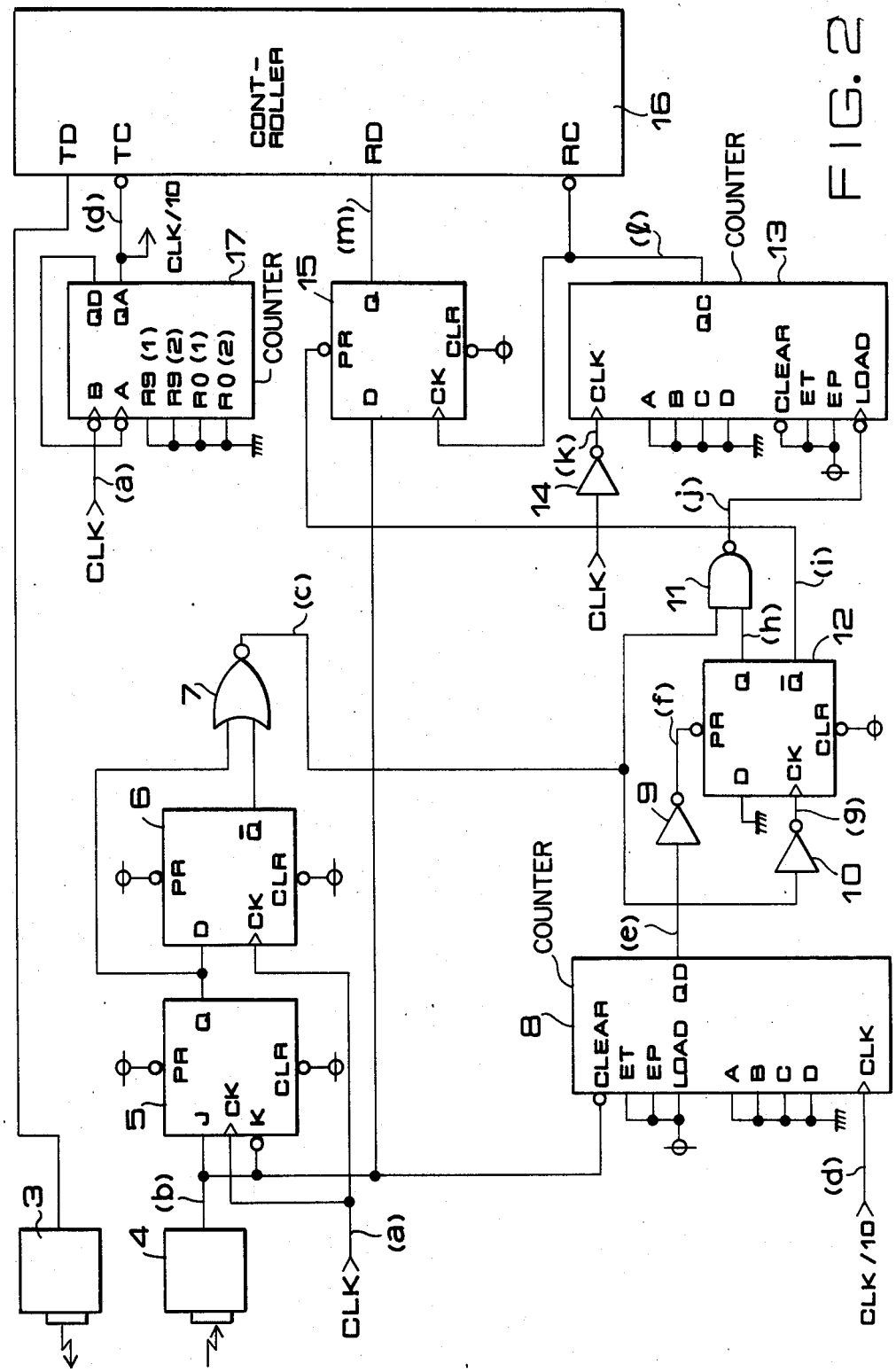
FIG. 2 is a block diagram of a pulse wave shaping apparatus according to the invention.

FIG. 2 is a circuit diagram illustrating basic constitution of a wave shaping apparatus according to the invention. The embodiment shows application of a HDLC (high level data link control) method in a light communication system wherein a synchronous data link controller 16 processes the incoming signal from a light receiver 4, after wave shaping by the present wave shaping apparatus, and outputs the processed signal through light transmitter 3. A reference clock signal (CLK) from an oscillator (not shown) is divided by 10 by decade counter 17 to produce to transmission clock signal (d) at the bit transmission frequency (CLK/10) for the controller 16.

In the wave shaping apparatus of FIG. 2, a light receiver 4 photoelectrically converts an incoming light signal into an electrical signal on its output (b) which is connected to the inputs of a J–K flipflop 5 which in turn has its output connected to the D input of a D-type flipflop 6. The reference clock signal (a) is applied to clock inputs of the flipflops 5 and 6. A NOR gate 7 has one input connected to the non-inverted output of flipflop 5 and has its other input connected to the inverted output of flipflop 6 so as to detect the fall of the incoming signal, and particularly to detect the leading edge of a "0" bit marking the end of a flag sequence constituted by N successive "1" bits preceding the start of a data bit train. A decade counter 8 has its clear input connected to the incoming electrical signal line (b) for being reset at each incoming "0" bit, and has its clock input connected to the output (d) of counter 17 to thus count successive incoming "1" bits. Output (e) of the counter 8 is connected by an inverter 9 to the preset input of a D-type flipflop 12 for setting the flipflop 12 when a flag sequence or n incoming high bits are received. The output of NOR gate 7 is connected by inverter 10 to the clock input of the flipflop 12, which has its D input held low, to reset flipflop 12 upon the fall or leading edge of the incoming low bit following the flag sequence. A NAND gate 11 has inputs connected to the output of NOR gate 7 and the noninverted output of flipflop 12 with its output connected to the load input of a 4-bit decade counter 13 which has its preset inputs set for a selected number, for example, 0000. The clock signal (CLK) is applied by inverter 14 to the clock input of counter 13. The third most significant bit output (QC) of couner 13 which goes high at the count of 4 and returns low at the count of 8, is connected to the clock input of a D-type flipflop 15 which has its data input connected to the incoming signal line (b) so that the level of the incoming signal line will be clocked or read into the flipflop 15 after a delay from the leading edge of each incoming bit. Additionally the inverted output (i) of flipflop 12 is connected to the preset input of flipflop 15 to insure that the output of flipflop 15 remains high until the initial low bit is read into flipflop 15 by the signal (1) on the output of counter 13 after counter 13 has been initialized by the signal on the output (j) of NAND gate 11.

The flipflops 5, 6, 12, 15 are connected to d.c. power source of +5 V, and the clock signal of frequency dividing by 10 is inputted to the 4-bit decade counter 8.

Figure 1:
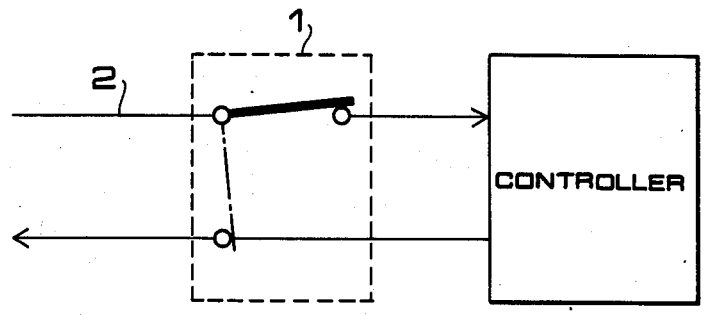
FIG. 1 a block diagram illustrating an apparatus for performing hardware analysis in a data transmission system of the prior art.
Figure 3:
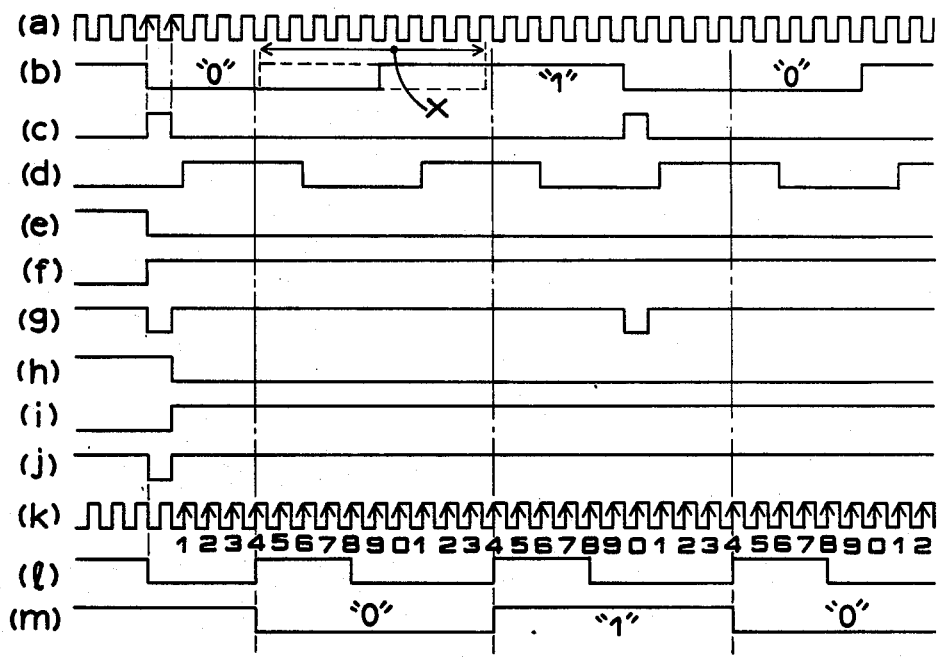
FIG. 3 is a waveform chart of signals in various portions of FIG. 2.

Operation of the above-mentioned apparatus will now be described. FIG. 3 shows waveform of signals in portions (a)–(m) of FIG. 2.

In the HDLC data link method, blocks or units of data are transmitted in bit trains called frames which include a flag sequence indicating the beginning of the block, address information, control information and the like. This flag sequence formed by n successive high bits (or a high extending over n or more bit periods) is separated by a low bit inserted before the first bit of the data so that the end of the flag sequence can be distinguished from the beginning of the data block. This initial low bit following a flag sequence enables the following data bit to be either high or low thereby not restricting the code system of the data being transmitted.

At the beginning of the transmission of a frame or train of bits, the signal (b) contains n successive high bits so that decade counter 8 is not cleared by a low on line (b) and counts the transmission clock sync pulses (d) to reach the value n (8 in the disclosed embodiment). When this count is reached the output (e) of counter 8 presets flipflop 12 which through output (h) enables the NAND gate 11. Now when the signal on incoming line (b) goes low indicating the end of the flag sequence or the beginning of the data, the output pulse (c) of NOR gate 7 is passed by NAND gate 11 to the load input (j) of decade counter 13 to reset the counter 13 to its preset count of 0000. The transition from high to low on incoming line (b) also clears the decade counter 8 removing any preset signal on flipflop 12 so that the pulse from the output (c) of NOR gate 7 can reset flipflop 12 to disable gate 11 and prevent further high to low transitions on incoming line (b) being passed to the load input of decade counter 13. Normal low bits in the data received in the frame on incoming line (b) after the flag sequence will clear counter 8 preventing it from producing an output pulse on line (e). Decade counter 13, after being initialized to the count 0000, continuously cycles through count 0 to count 9 in synchronism with each successive incoming data bit (b). Each time the counter 13 reaches the count of 4, the flipflop 15 is clocked by output (1) of counter 13 to read the data bit on incoming line (b). This reading of each successive incoming bit on line (b) is thus delayed from the leading edge of the incoming data bit by 4 reference clock pulses during each cycle of counter 13 to thus generate regenerated bit train (m) on the output of flipflop 15 which is free of distortion.

Thus wave distortion (pulse width distortion) produced during transmitting in the transmission system and ranging within ±50% (range x in FIG. 3) is corrected, and hardware analysis can be performed even at data link control in loop system.

The invention is not restricted to the circuit constitution shown in FIG. 2, but may be applied also to SDLC method and other similar data link control.

I claim:

1. A wave shaping apparatus which eliminates pulse width distortion of each pulse of an incoming pulse train composed of a series of pulses having a prescribed width, said apparatus comprising:
   means for detecting a leading edge of an initial pulse of an incoming pulse train to generate an initializing pulse;
   means for generating clock pulses at a prescribed frequency to produce a plurality of clock pulses during each pulse of the pulse train;
   said detecting means including as J-K flipflop having inputs receiving the incoming pulse train, a D-type flipflop having a data input connected to an output of the J-K flipflop and having a clock input receiving the clock pulses, and a NOR gate having inputs connected to outputs of the respective J-K flipflop and D-type flipflop so as to generate an initializing pulse at the leading edge of an initial pulse;
   a counter, having a count initialized by the initializing pulse, for cyclically counting the plurality of clock pulses to generate a read signal each cycle when the count reaches a prescribed value corresponding to a delay from the leading edge of each pulse in the incoming pulse train; and
   wave shape regenerating means operated at each read signal from the counter for receiving the high or low value in the pulse train to produce a regenerated pulse train of the incoming pulse train.

2. A wave shaping apparatus which eliminates pulse width distortion of each pulse of an incoming pulse train composed of a series of pulses having a prescribed width, said apparatus comprising:
   means for detecting a leading edge of an initial pulse of an incoming pulse train to generate an initializing pulse;
   clock pulse generating means for generating clock pulses at a frequency of the pulses in the incoming pulse train to produce a plurality of clock pulses during each pulse of the pulse train;
   a decade counter, having a count initialized by the initializing pulse, for cyclically counting the plurality of clock pulses to generate a read signal each cycle when the count reaches a prescribed value corresponding to a delay from the leading edge of each pulse in the incoming pulse train; and
   wave shape regenerating means operated at each read signal from the counter for receiving the high or low value in the pulse train to produce a regenerated pulse train of the incoming pulse train.

3. An apparatus as set forth in claim 2 wherein said decade counter is a synchronous 4-bit decade counter.

4. An apparatus as set forth in claim 2 wherein the decade counter includes means for generating the read signal when the count reaches a value of 4.

5. An apparatus as set forth in claim 2 wherein said counter includes count setting means responsive to the initializing pulse for setting the counter to zero.

6. An apparatus as set forth in claim 1 wherein said detecting means further includes second counting means which counts clock pulses over a period corresponding to a predetermined number of pulses in the incoming pulse train, means for resetting the count of the second counting means upon each low pulse in the incoming pulse train so that the second counting means generates an output signal upon a series of the predetermined number of incoming high pulses corresponding to a flag sequence, a second flipflop having a preset input connected to the output of the second counter means and having input means from the NOR gate for resetting the second flipflop, and a NAND gate having inputs connected to outputs of the NOR gate and the second flipflop for generating the initializing pulse upon the fall of a low pulse succeeding the flag sequence.

7. A wave shaping apparatus which eliminates pulse width distortion of each pulse of an incoming pulse train composed of a series of pulses having a prescribed width, said apparatus comprising:
   means for detecting a leading edge of an initial pulse of an incoming pulse train to generate an initializing pulse;
   means for generating clock pulses at a prescribed frequency to produce a plurality of clock pulses during each pulse of the pulse train;
   a counter, having a count initialized by the initializing pulse, for cyclically counting the plurality of clock pulses to generate a read signal each cycle when the count reaches a prescribed value corresponding to a delay from the leading edge of each pulse in the incoming pulse train; and
   wave shape regenerating means operated at each read signal from the counter for receiving the high or low value in the pulse train to produce a regenerated pulse train of the incoming pulse train;
   said wave shape regenerating means including a D-type flipflop having a data input receiving the incoming pulse train and having a clock input operated by the read signal so that the output of the D-type flipflop produces the regenerated pulse train.

* * * * *